US011378602B2

(12) United States Patent
Chamberlain (10) Patent No.: US 11,378,602 B2
(45) Date of Patent: Jul. 5, 2022

(54) TAP, METER AND TRANSFORMATION DEVICE FOR POWER DISTRIBUTION FROM HFC PLANT

(71) Applicant: CommScope, Inc. of North Carolina, Hickory, NC (US)

(72) Inventor: John C. Chamberlain, Hickory, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 802 days.

(21) Appl. No.: 16/284,163

(22) Filed: Feb. 25, 2019

(65) Prior Publication Data

US 2019/0187192 A1 Jun. 20, 2019

Related U.S. Application Data

(63) Continuation of application No. PCT/US2017/053277, filed on Sep. 25, 2017.
(60) Provisional application No. 62/400,888, filed on Sep. 28, 2016.

(51) Int. Cl.
*G01R 19/25* (2006.01)
*H01R 9/05* (2006.01)
(Continued)

(52) U.S. Cl.
CPC ......... *G01R 19/2513* (2013.01); *H01R 9/053* (2013.01); *H01R 9/0509* (2013.01);
(Continued)

(58) Field of Classification Search
CPC ... H04B 1/00; H04B 3/00; H04B 7/00; H04B 10/00; H04B 17/00; G01R 1/00;
(Continued)

(56) References Cited

U.S. PATENT DOCUMENTS 2,550,689 A * 5/1951 Gustafson .............. G01R 21/00
324/95
4,266,842 A 5/1981 Dillon, Jr. et al.
(Continued)

OTHER PUBLICATIONS

Fan Cai et al., Self-Powered Advanced Meter Design for Smart Grid, Microwave Conference Proceedings (APMC), 2010 Asia-Pacific, IEEE, Dec. 7, 2010, pp. 1380-1383, XP031928915.

*Primary Examiner* — Jermele M Hollington
*Assistant Examiner* — Temilade S Rhodes-Vivour
(74) *Attorney, Agent, or Firm* — -Muncy, Geissler, Olds & Lowe, P.C.

(57) ABSTRACT

A power metering device includes a tap unit including a clamp for engaging a coaxial cable and a probe for electrically coupling to a center conductor of the coaxial cable without damaging the center conductor. A power consumption meter and a power port are electrically connected to the probe. A power transformer is optionally connected between the probe and the power port. A housing surrounds the meter and transformer. The power port supplies power to a customer device, and the meter measures an amount of power passing through the power port. The power consumed by the customer device is reported by the meter to a modem within the housing. The modem may utilize the probe and the center conductor of the coaxial cable to send power consumption data to a service provider, so that an operator of the customer device may be billed and/or the customer device may be controlled to limit its power consumption. Further, the modem may transfer data between the customer device and the service provider.

20 Claims, 10 Drawing Sheets

(51) Int. Cl.
  *H02J 11/00* (2006.01)
  *H02J 50/10* (2016.01)
  *H01R 9/053* (2006.01)
  *G01R 15/14* (2006.01)
(52) U.S. Cl.
  CPC .............. *H02J 11/00* (2013.01); *H02J 50/10* (2016.02); *G01R 15/142* (2013.01)
(58) Field of Classification Search
  CPC ........ G01R 13/00; G01R 19/00; G01R 23/00; G01R 35/00; G01F 21/00
  See application file for complete search history.

(56) References Cited

U.S. PATENT DOCUMENTS

| | | | |
|---|---|---|---|
| 4,602,364 A | 6/1986 | Herman et al. | |
| 4,691,976 A | 9/1987 | Cowen | |
| 4,738,009 A | 4/1988 | Down et al. | |
| 5,171,162 A * | 12/1992 | Kaufman | H01R 9/0509 439/425 |
| 5,203,721 A | 4/1993 | Buck | |
| 5,281,933 A | 1/1994 | Chamberlin | |
| 5,945,634 A | 8/1999 | Shimirak et al. | |
| 6,177,884 B1 | 1/2001 | Hunt et al. | |
| 6,312,281 B1 * | 11/2001 | Rodriguez | H01R 13/6658 439/98 |
| 6,660,939 B1 * | 12/2003 | Gunnels | H01R 9/0509 174/75 C |
| 8,947,319 B2 | 2/2015 | Simmons et al. | |
| 2008/0109387 A1 | 5/2008 | Deaver et al. | |
| 2008/0317472 A1 | 12/2008 | Park et al. | |
| 2010/0084920 A1 | 4/2010 | Banting et al. | |
| 2014/0143578 A1 * | 5/2014 | Cenizal | H02J 3/007 713/340 |
| 2015/0067755 A1 | 3/2015 | Conroy et al. | |
| 2015/0137596 A1 | 5/2015 | Steiner-Jovic et al. | |
| 2015/0311990 A1 * | 10/2015 | Pikelja | H04B 17/309 455/226.4 |

* cited by examiner

TAP, METER AND TRANSFORMATION DEVICE FOR POWER DISTRIBUTION FROM HFC PLANT

This application is a continuation of International Application No. PCT/US2017/053277, filed Sep. 25, 2017, which claims the benefit of U.S. Provisional Application No. 62/400,888, filed Sep. 28, 2016, both of which are herein incorporated by reference.

BACKGROUND OF THE INVENTION

1. Field of the Invention

The present invention relates to a tap unit for accessing a center conductor of a coaxial cable in mid-span, without terminating the coaxial cable. The tap unit may include a power consumption meter and/or a transformer, so as to measure and/or convert a characteristic of power tapped from the coaxial cable.

2. Description of the Related Art

Figure 1:
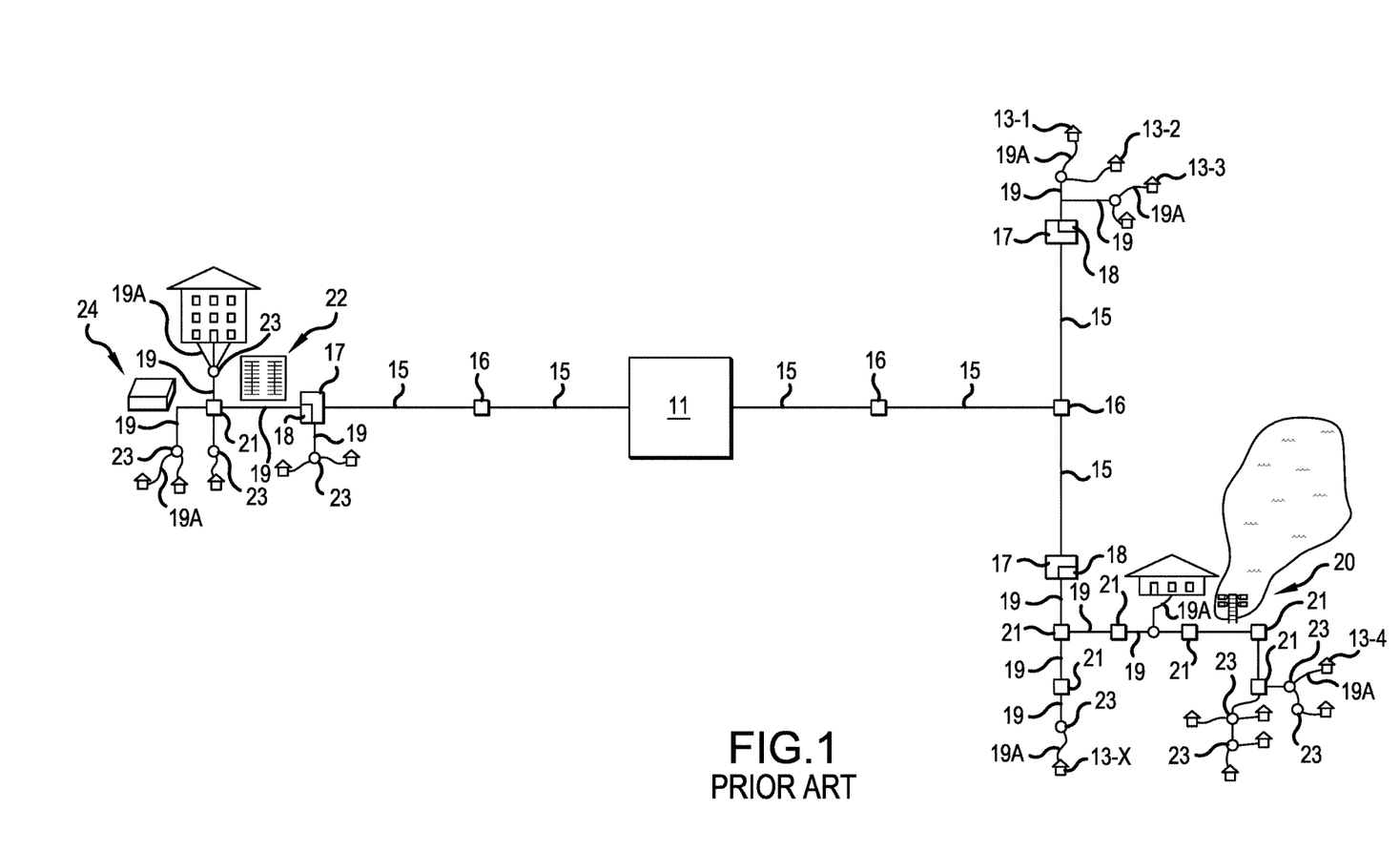
FIG. 1 is a block diagram showing a hybrid fiber coaxial (HFC) network, in accordance with the prior art.

As shown in FIG. 1, communications networks often transmit cable television signals and/or other information, like broadband Internet and/or telephone services, between a service provider center 11 and a plurality of subscribers 13-1, 13-2, 13-3, . . . , 13-$x$ over a combination of optical fiber cable 15 and/or coaxial cable 19. Such networks are often referred as hybrid fiber-coaxial ("HFC") networks. In an HFC network, fiber optic cables 15 are typically used to carry signals from the facilities of the service provider center 11 to various distribution points 17, and repeaters 16 may be located between the service provider center 11 and the distribution points 17, e.g., spaced one to several miles apart. Less expensive coaxial cables 19 are used to carry the signals from the distribution points 17 into regions (many miles), into neighborhoods (several miles) and/or into individual homes or businesses (usually well less than a mile). Often times, the HFC network is also referred to as a Fiber-to-the-x ("FTTx") network, wherein x is the name of the distribution point 17, where the signal on optical fiber cable is transferred to a signal on a coaxial cable. For example, Fiber-to-the-curb ("FTTC") and Fiber-to-the-home ("FTTH") are commonly used acronyms.

When the length of the coaxial cable 19 between the distribution point 17 and the subscriber 13-$x$ exceeds a particular length, for example 2,500 feet, one or more amplifiers 21 are needed. The amplifier 21 boosts up the communication signal carried on the center conductor of the coaxial cable 19, so that the signal can continue along the length of the coaxial cable 19 without suffering attenuation levels, which might lead to data errors. The amplifiers 21 need power to operate. Often times, a power source is not located conveniently to the amplifier's installed location, e.g., at intervals of 2,500 along an expanse of coaxial cable 19.

In the background art, the distribution point 17 is typically located adjacent to a reliable power source. The distribution point 17 has lots of electronic equipment housed inside of a weather resistant cabinet, such as optical-to-electrical converters (0/E converters) and electrical-to-optical converters (E/O converters), cooling/heating and humidity regulating systems to maintain a suitable environment within the cabinet, and a power back up system, like batteries and associated recharging equipment. Within the cabinet of the distribution point 17 is also housed a power inserter 18. The power inserter 18 adds a power signal to the center conductor of the coaxial cable 19. Typically, the power signal is an AC power signal of less than ninety volts, like an eighty nine volt signal at sixty hertz, having a saw tooth or trapezoidal shape.

The AC power signal is used by the amplifiers 21 to amplify the radio frequency (RF) signals on the center conductor, as the RF signals are sent in the upstream and downstream directions away from the amplifier 21. The service provider is often a cable television company that may have exclusive rights to offer cable television services in particular geographic areas. The subscribers 13-$x$ in a cable television network may include, for example, individual homes, apartments, hotels, colleges, and various businesses and other entities. The cable television service provider may offer subscribers 13-$x$ a variety of different services. By way of example, the services might include basic television, premium television (including pay-per-view and movies-on-demand), broadband Internet service, and digital telephone service.

A tap 23 refers to a unit placed very close to one or more subscribers 13-$x$, such as individual homes or a business. The tap 23 is connected to the coaxial cable 19 and has one or more end-user ports. A smaller diameter coaxial cable 19A, like RG6, is attached to the end user port and runs into the house or business for attachment to the end user's devices, like a computer modem, TV tuner, DVR, etc. The tap 23 removes the AC power signal, so that the AC power signal is not present at the end user ports and not sent into the end user's home or business.

SUMMARY OF THE INVENTION

The Applicant has appreciated that certain providers may wish to install electronic devices in areas, where traditional power sources, e.g., outlets connected to power lines, are not readily available. Electronic devices like small cell devices to expand cellular calling and WiFi capabilities are often desired in remote areas. Further, such devices are often desired in high-traffic areas to supplement the existing resources, where data usage is at or near the maximum capacity of the existing base stations, cellular towers and WiFi hot spots. Also, security cameras are often desired in areas like marinas 20, parking lots 22, storage facilities 24, etc. to provide video images to law enforcement agencies, security agencies and/or property owners or facility management offices via in Internet feed.

Sometimes the coaxial cable 19 is present in these remote and/or high-traffic areas, whereas traditional power lines are not present. Also, even if traditional power lines are present, tapping power from a power line where no outlets are present can be very expensive, as one needs to contact the power company and pay for the installation and cost of an expensive transformer, power meter and outlet, as well as the monthly billing for the power supplied by the power company.

It has been proposed in the prior art to cut the coaxial cable 19 and install an electronic device. See US Published Application No. 2015/0067755, which is herein incorporated by reference. However, cutting the coaxial cable 19 has many drawbacks. For example, such cutting installations require a shutdown of the coaxial cable's signal feed, causing interruption of service to any users downstream of the cut location on the coaxial cable 19. Such interruptions can be annoying and costly to individuals and businesses who subscribe to the services provided by the service provider center 11. As such, the service provider center 11 will be reluctant to allow third parties to access the power on the coaxial cable 19.

Moreover, the power consumed by the person installing a device in the mid-span of the coaxial cable 19 might draw an excessive amount of power, such that the amplifiers 21 downstream of the electronic device might cease to function. Therefore, the service provider 11 will be reluctant to jeopardize the integrity of the subscription services to its paying customers downstream of an electronic device on the coaxial cable 19, by offering unhindered and unmonitored power consumption from the coaxial cable 19 to a third party.

It has also been appreciated by the Applicant that third party electronic devices may have different power requirements and that the power signal carried on the coaxial cable 19 may not be suitable to many electronic devices.

The Applicant has invented a device and method aimed at addressing one or more of the drawbacks in the background art, as appreciated by the Applicant.

These and other objects are accomplished by a device including a tap unit including a clamp for engaging a coaxial cable and a probe for electrically coupling to a center conductor of the coaxial cable without damaging the center conductor. A power consumption meter and a power port are electrically connected to the probe. A power transformer is optionally connected between the probe and the power port. A housing surrounds the meter and transformer. The power port supplies power to a device, and the meter measures an amount of power passing through the power port. The power consumed by the device is reported by the meter to a gateway or modem within the housing. The modem may utilize the probe and the center conductor of the coaxial cable to send power consumption data to a service provider, so that an operator of the device may be billed and/or the device may be controlled to limit its power consumption. Further, the modem may transfer data between the device and the center conductor of the coaxial cable using the power port or a separator data port.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
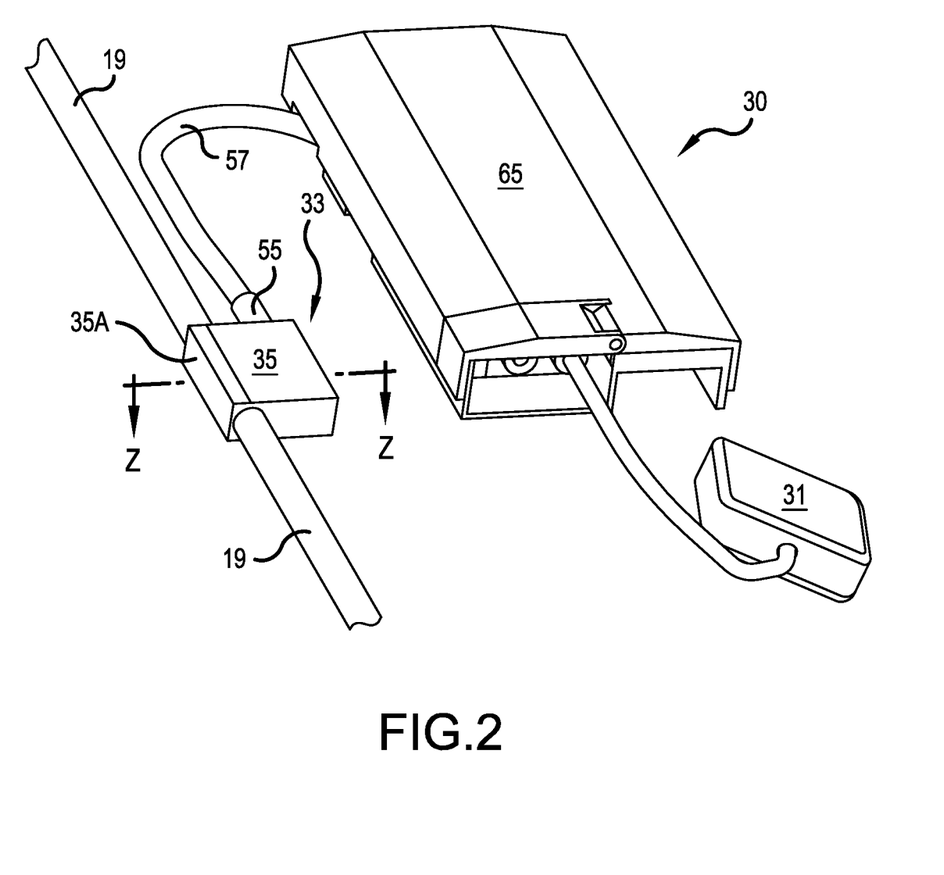
FIG. 2 is a top, front perspective view of a power metering device, in accordance with the present invention.

FIG. 2 is a top, front perspective view of a power metering device 30 connected to a customer device 31, as the power metering device 30 is being assembled onto a coaxial cable 19. The power metering device 30 includes a tap unit 33. The tap unit 33 includes a clamp 35, 35A for engaging onto an outer jacket 49 of the coaxial cable 19. The clamp 35, 35A attaches to an exterior of the outer jacket 49 of the coaxial cable 19 by a frictional engagement and may include threaded fasteners to pull a first element 35A of the clamp 35, 35A toward a second element 35 of the clamp 35, 35A and sandwich the coaxial cable 19 into complementary curved, cutout portions formed in the first and second elements 35A and 35 of the clamp 35, 35A. Alternatively, a glue or epoxy may be used to affix the clamp 35, 35A to the outer jacket 49 of the coaxial cable 19. Inside the tap unit 33 is a probe for electrically coupling to a center conductor of the coaxial cable 19. The exterior surfaces of the clamp 35, 35A function as a tap unit housing for surrounding the probe.

Figure 3:
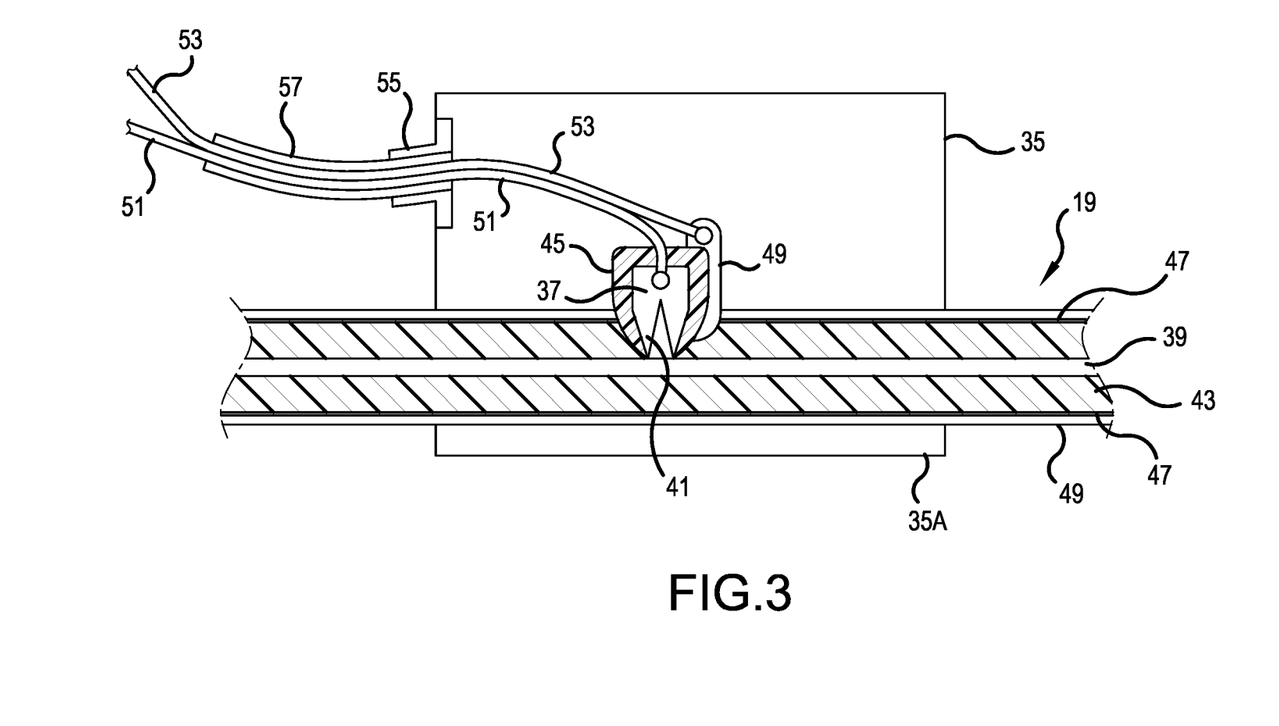
FIG. 3 is a cross sectional view taken along line Z-Z in FIG. 2 and depicts a probe, in accordance with a first embodiment of the present invention.

The cross sectional view of FIG. 3 illustrates a first embodiment of the probe, which includes a conductive element 37 for electrically engaging or contacting a center conductor 39 of the coaxial cable 19, without damaging the center conductor 39. In a preferred embodiment, the conductive element 37 has at least one sharp end 41, such as the depicted two sharp ends 41, for penetrating a dielectric layer 43 surrounding the center conductor 39 of the coaxial cable 19. In the first embodiment, the two sharp ends 41 are surround by an insulation layer 45. The insulation layer 45 prevents the conductive element 37 and the sharp ends 41 from making electrical contact with one or more shielding layers 47, located between the outer jacket 49 of the coaxial cable 19 and the dielectric layer 43.

Just outside of the insulation layer 45 is an electrode 49 for establishing electrical contact with the one or more shielding layers 47 of the coaxial cable 19. Electrical leads 51 and 53 are connected to the conductive element 37 and the electrode 49, respectively. The electrical leads 51 and 53 pass through a bushing or strain relief boot 55 into an insulated cable 57. Although FIG. 3 has depicted a particular embodiment of the "physical contacting" probe, other embodiments of "physically contacting" probes may be used in conjunction with the present invention, such as the probes illustrated in U.S. Pat. Nos. 4,266,842; 4,691,976; 4,738,009; 5,203,721; and 8,947,319, which are herein incorporated by reference.

Figure 4:
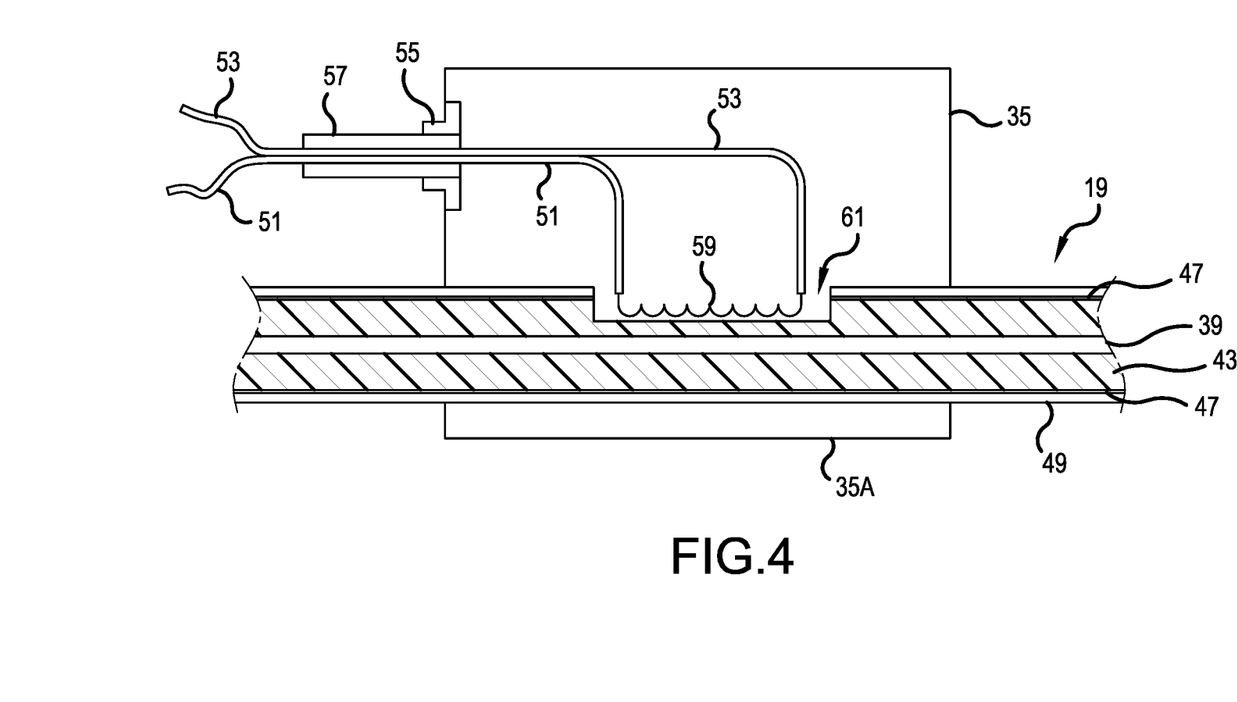
FIG. 4 is a cross sectional view taken along line Z-Z in FIG. 2 and depicts a probe, in accordance with a second embodiment of the present invention.

The cross sectional view of FIG. 4 illustrates a second embodiment of the probe, which includes an inductive element 59 for inductively coupling to the center conductor 39 of the coaxial cable 19. In a preferred embodiment, the inductive element 59 is a coil dimensioned to reside within a slit 61 formed in the dielectric layer 43 surrounding the center conductor 39 of the coaxial cable 19. Although FIG. 4 has depicted a particular embodiment of the "inductive" probe, other embodiments may be used in conjunction with the present invention, such as the probe illustrated in U.S. Pat. No. 5,945,634, which is herein incorporated by reference.

Figure 5:
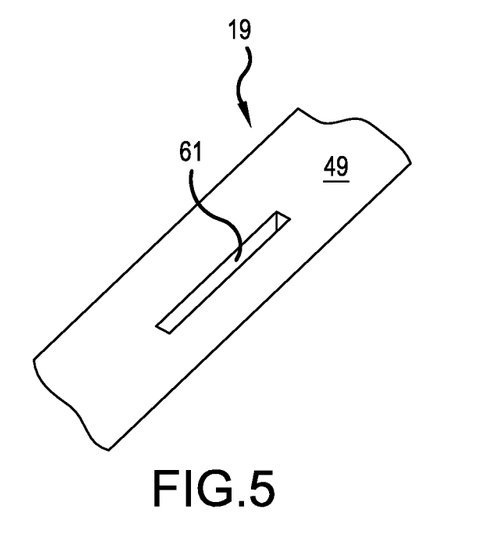
FIG. 5 is a top, perspective view of a coaxial cable with a slit for accepting an inductive probe.

FIG. 5 is a perspective view of the slit 61 in the coaxial cable 19 prior to the insertion of the inductive element 59 into the slit 61. The slit 61 passes completely through the outer jacket 49 and the one or more shielding layers 47. In a preferred embodiment, the slit 61 stops short of passing entirely through the dielectric layer 43, leaving a thin section of the dielectric layer 43 residing between the center conductor 39 and the inductive element 59.

Figure 6:
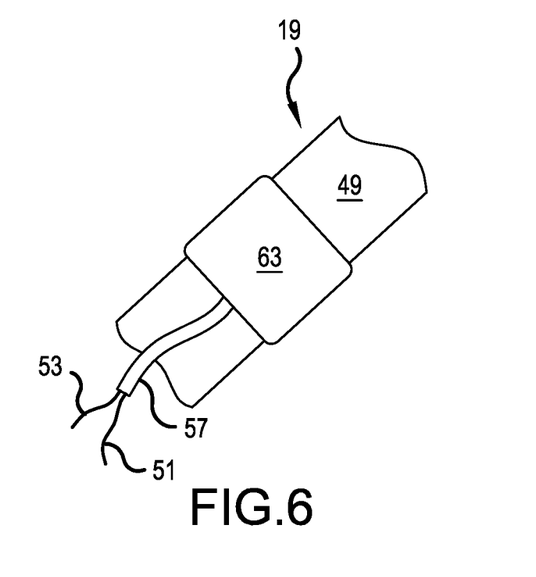
FIG. 6 is a top, perspective view of the coaxial cable of FIG. 5, after the probe has been installed and sealed.

FIG. 6 is the same perspective view of the coaxial cable 19, as shown in FIG. 5, after the inductive element 59 has been inserted into the slit 61 and a heat shrink wrap 63 has been applied to seal the slit 61 and the inductive element 59 therein. The insulated cable 57 would pass out from under the heat shrink wrap and lead to a main body or outer housing 66 of the power metering device 30, as will be described in further detail hereinafter.

Figure 7:
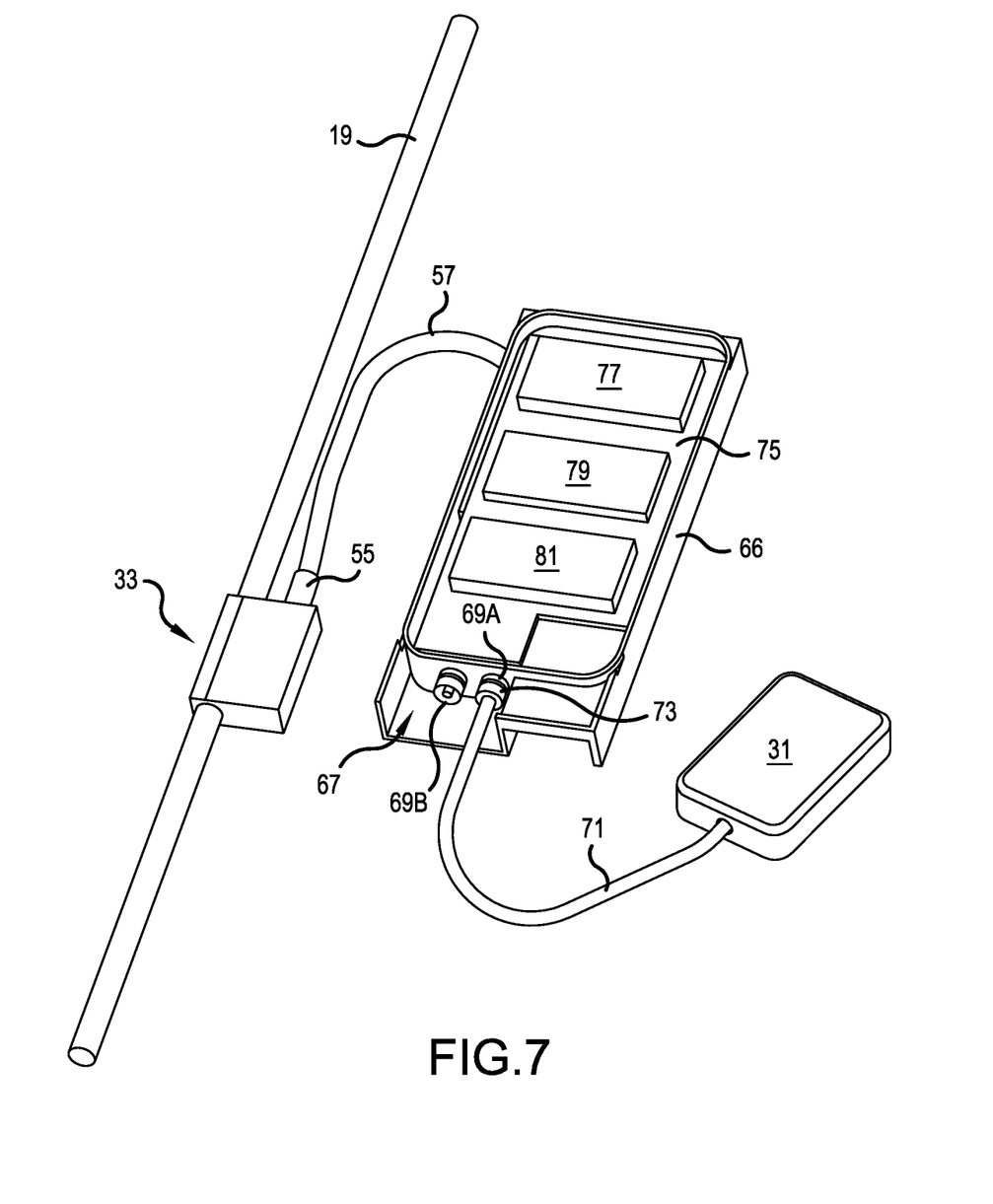
FIG. 7 is a top, front perspective view of the power metering device of FIG. 2 with a top cover removed.

FIG. 7 is a top, front perspective view of the power metering device 30 connected to a customer device 31, as shown in FIG. 2. However, in FIG. 7, a top cover 65 is removed from the outer housing 66 of the power metering device 30. The outer housing 66 has a port compartment 67. Inside the port compartment 67, resides one or more power ports 69, such as the first and second power ports 69A and 69B, as illustrated in FIG. 7. More or fewer power ports may be provided inside of the port compartment 67, such as one power port, three power ports, etc. The power ports 69 may be coaxial ports or any other type of port for a coaxial cable, twisted pair cable, fiber optic cable or a hybrid port.

The customer device 31 is connected to the power port 69 by a cord 71 having a mating connector 73 for the power port 69. Inside the outer housing 66 of the power metering device 30, resides a circuit board 75 with components mounted thereon. The outer housing 66 in combination with the top cover 65 surround the circuit board 75 and provide protection from the environmental elements. In one embodiment, the components include at least one gateway or modem 77, at least one power consumption meter 79 and at least one transformer 81.

Figure 8:
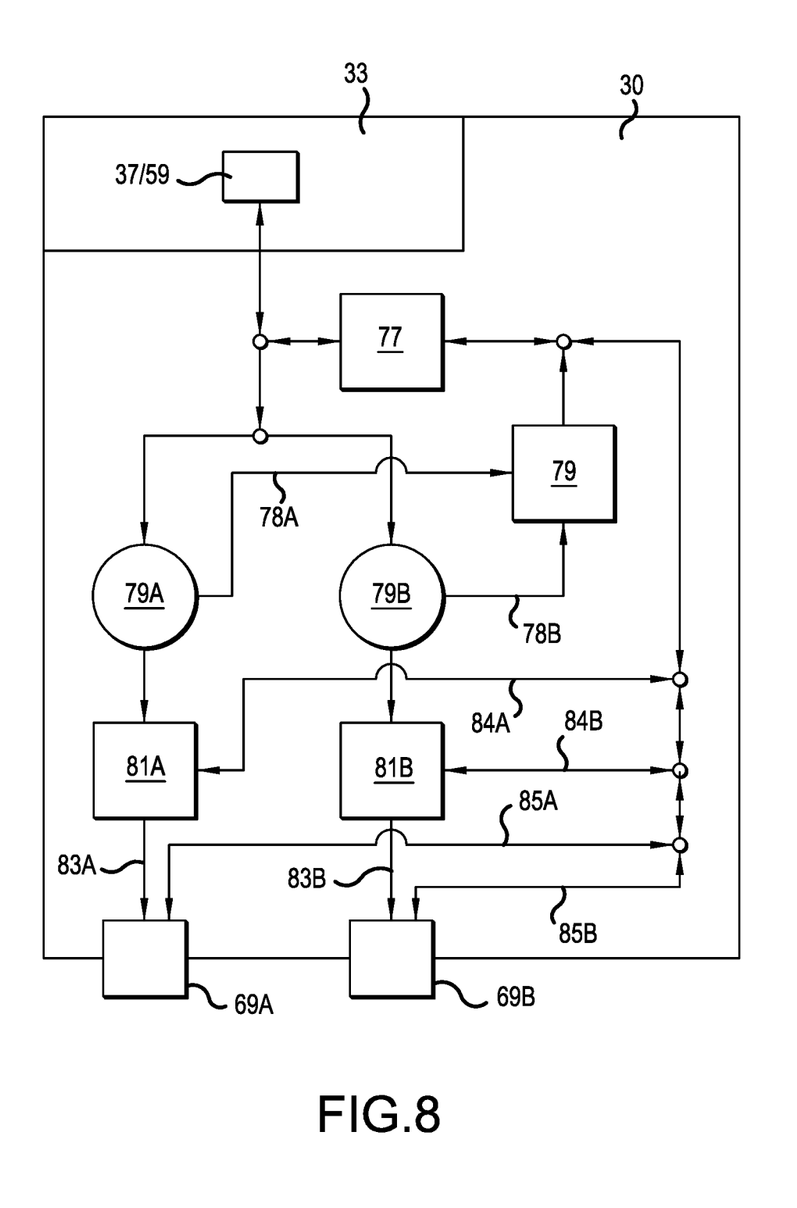
FIG. 8 is a schematic illustration of components on a circuit board within the power metering device.

As best seen in the schematic of FIG. 8, the probe 37 or 59 is electrically connected to a first power consumption sensor 79A, which sends a first measurement signal 78A to the power consumption meter 79. In one embodiment, the first power consumption sensor 79A may be formed as a coil and one of the electrical leads 51 and 53 may pass through a center of the coil, such as the common clamp-around sensors for measuring amperage as available in electrical supply stores. The first power consumption sensor 79A is electrically connected to a first transformer 81A. The first transformer 81A is electrically connected to the first power port 69A.

As previously mentioned, the power signal on the center conductor 39 of the coaxial cable 19 is typically an AC signal of about eighty nine volts at sixty hertz, having a saw tooth or trapezoidal shape. The first transformer 81A changes one or more characteristics of power provided by the center conductor 39 of the coaxial cable 19 before the power is supplied to the first power port 69A. The one or more characteristics may include at least one of converting an AC power signal to a DC power signal, changing a voltage level of a power signal, changing a wave form profile of a power signal, and changing a frequency of a power signal.

For example, the customer device 31 may require a DC power signal of twenty volts and 100 milliamps. Alternatively, the customer device 31 may require two power signals, with a first signal being a DC signal of five volts and 500 milliamps and a second signal being a sinusoidal AC signal at 60 hertz and an RMS voltage of 10 volts and 100 milliamps. The first power port 69A may include as many electrical leads as needed to supply the voltage and amperage requirements of the customer device 31. The electrical leads of the first power port 69A are graphically illustrated by the arrow 83A in FIG. 8. Hence, the first power port 69A supplies power taken from the center conductor 39 of the coaxial cable 19 to the customer device 31 connected to the first power port 69A.

FIG. 8 also illustrates that the outer housing 66 may also include a second power port 69B inside of the port compartment 67. The probe 37 or 59 is electrically connected to a second power consumption sensor 79B, which sends a second measurement signal 78B to the power consumption meter 79. The second power consumption sensor 79B may be formed identically to the first power consumption sensor 79A. The second power consumption sensor 79B is electrically connected to a second transformer 81B. The second transformer 81B is electrically connected to the second power port 69B. Hence, the power consumption meter 79 receives separate measurements relating to the power delivered to the first and second power ports 69A and 69B. The second power transformer 81B changes one or more characteristics of power provided to the second power port 69B. Further, the second transformer 81B may be configured differently than the first transformer 81A, so that power supplied to electrical leads 83B of the second port 69B may have different characteristics than power supplied to the electrical leads 83A of the first port 69A. This can be useful when a device connected to the second power port 69B requires a different type of power signal.

As also illustrated in FIG. 8, the modem 77 is electrically connected to the probe 37 or 59. In a preferred embodiment, the modem 77 is a DOCSIS (Data Over Cable Service Interface Specification) modem, so that the data transmitted to and from the modem 77 will be compatible with the signals already present on the coaxial cable 19. The modem 77 receives signals from the power consumption meter 79. For example, the modem 77 receives the first and second measurement signals 78A and 78B and separately reports the power consumption values to the service provider center 11 via the center conductor 39 of the coaxial cable 19.

Optionally, the first and second transformers 81A and 81B could be connected to the modem 77 via first and second links 84A and 84B. By this arrangement, the first and second transformers 81A and 81B may be monitored for performance and/or remotely controlled by the service provider center 11. For example, the service provider center 11 may program the functionality of the first transformer 81A and create a power output signal suitable for a particular type of customer device 31 to be plugged into the first power port 69A.

The modem 77 may be electrically connected via a third link 85A to communication leads in the first power port 69A, so that data may be communicated back and forth between the service provider center 11 and the customer device 31 connected to the first power port 69A. The modem 77 may also be electrically connected via a fourth link 85B to communication leads in the second power port 69B, so that data may be communicated back and forth between the service provider center 11 and any device connected to the second power port 69B. Further, the first and second power ports 69A and 69B need not be used to communicate data to and from the devices, as the outer housing 66 may be provided with one or more dedicated communication ports, such as RJ-45 ports, separate from the first and second power ports 69A and 69B to deal with data communications, so that the third and fourth links 85A and 85B lead to data ports separate from the first and second power ports 69A and 69B.

Figure 9:
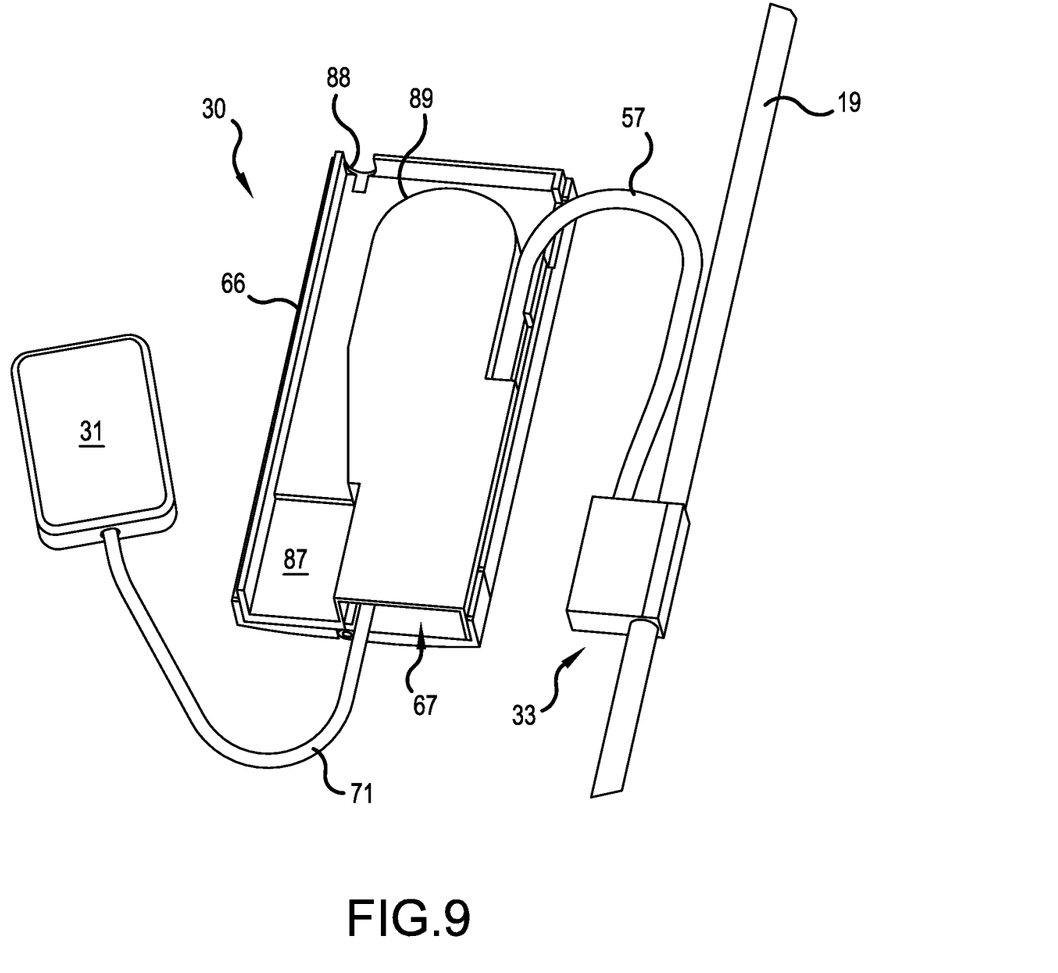
FIG. 9 is a bottom, front perspective view of the power metering device of FIG. 2.

FIG. 9 is a bottom, front perspective view of the power metering device 30 of FIG. 2. FIG. 9 illustrates that a bottom surface of the outer housing 66 includes a pocket 87 dimensioned to accept the housing of the tap unit 33. The outer housing 66 is attached to the tap unit 33, e.g., by a snap fit and/or by one or more screws, after the tap unit 33 is clamped onto the coaxial cable 19 and nested into the pocket 87. The bottom surface also includes a notch 88 for accepting the coaxial cable 19. The bottom of the outer housing 66 also includes a guide surface 89 for accepting the insulated cable 57 from the tap unit 33, as will be better seen in FIG. 10.

Figure 10:
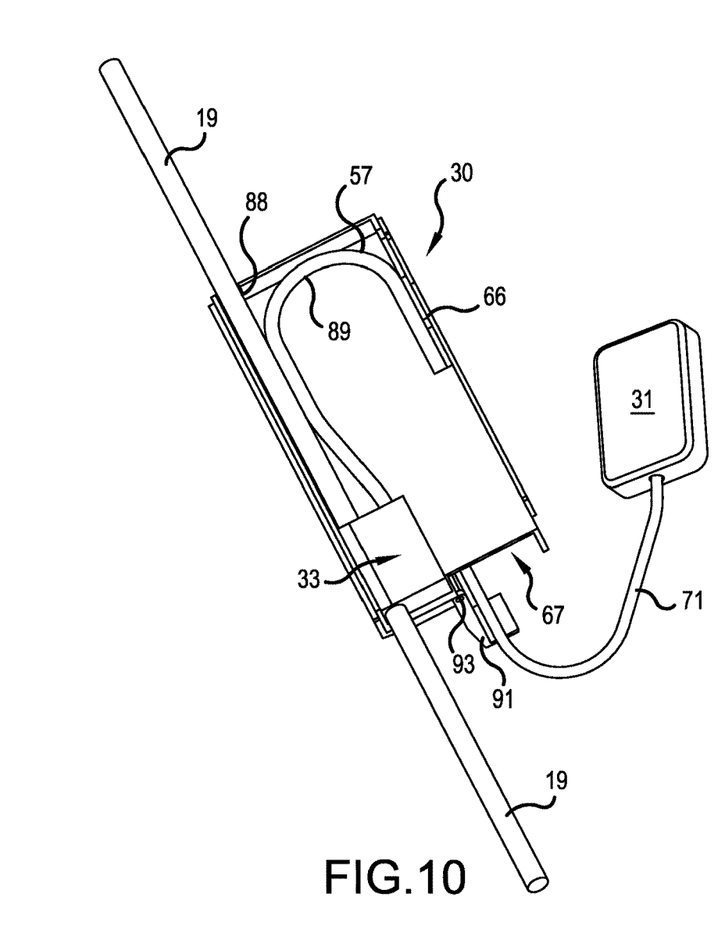
FIG. 10 is a bottom, front perspective view of the power metering device of FIG. 9, after a tap unit has been installed into a pocket of the power metering device.

FIG. 10 is bottom, front perspective view of the power metering device 30, similar to FIG. 9, but illustrating the tap unit 33 nested into the pocket 87 of the outer housing 66. Note how the insulated cable 57 from the tap unit 33 rests against the guide surface 89, and the tap unit 33 tightly fits into the pocket 87. By this arrangement, the entire power metering device 30 may be supported by the coaxial cable 19.

Figure 11:
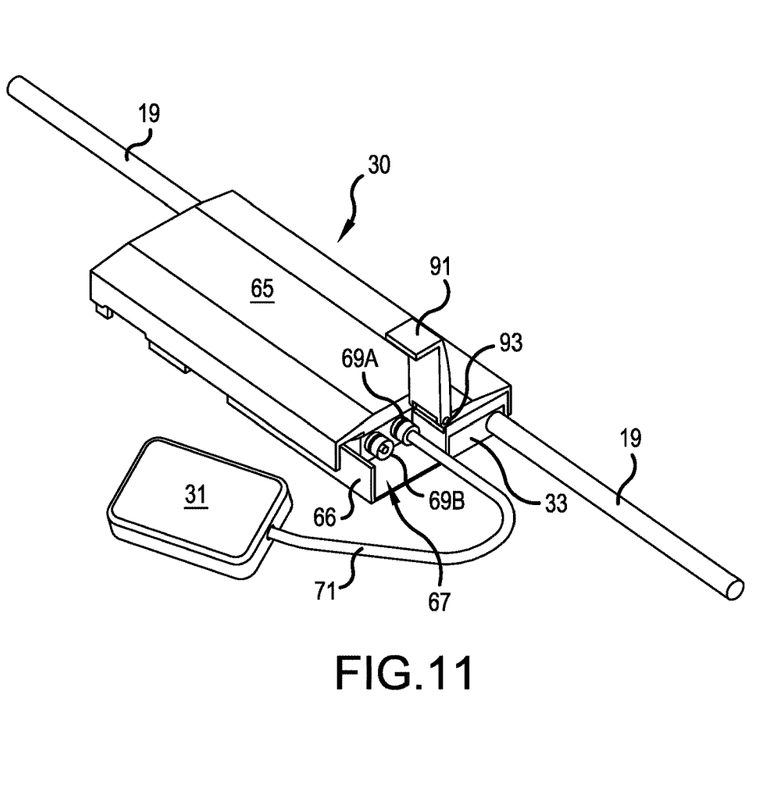
FIG. 11 is a top, front perspective view of the power metering device of FIG. 10.

FIG. 11 is a top, front perspective view the power metering device 30 of FIG. 10. Of interest in FIG. 11 is the door 91. The door 91 covers the top side of the port compartment 67, and is connected to the top cover 65 by a hinge 93. Opening the door 91 provides easy access to the first and second power ports 69A and 69B. Of course, additional ports, like more power ports and/or communication ports may be included within the port compartment 67 and be accessible when the door 91 is opened as shown in FIGS. 10 and 11.

Figure 12:
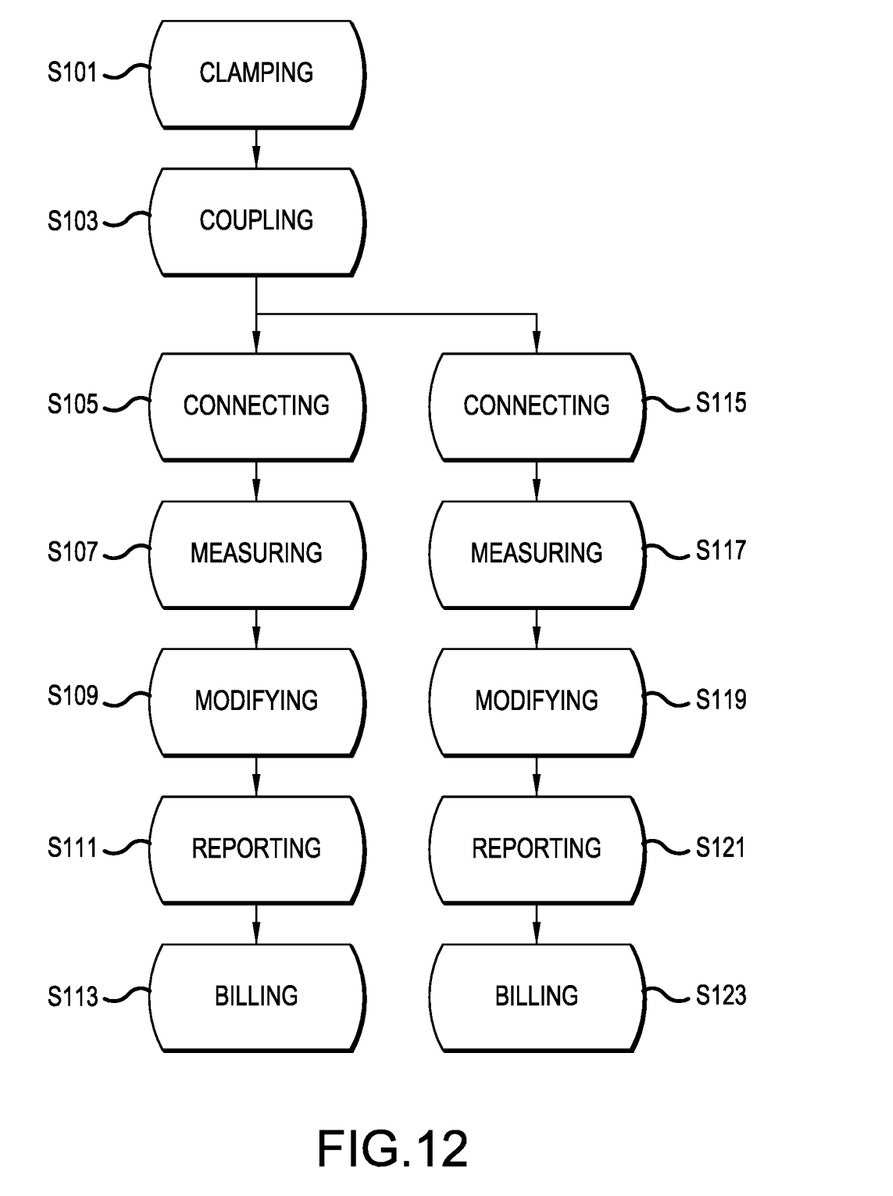
FIG. 12 is a flow chart illustrating a method, in accordance with the present invention.

Now with reference to FIG. 12, an embodiment of a method of the present invention will be described. The method of metering power consumption from a coaxial cable 19 includes clamping (S101) the tap unit 33 onto the coaxial cable 19. Electronically coupling (S103) the probe 37 or 59 of the tap unit 33 to the center conductor 39 of the coaxial cable 19.

Connecting (S105) the customer device 31 to the first power port 69A of the power metering device 30, wherein the first power port 69A is directly or indirectly electrically connected to the probe 37 or 59. Measuring (S107) an amount of power passing through the probe 37 or 59 or passing through the first power port 69A.

Providing the power transformer 81A electrically connected between the probe 37 or 59 and the first power port 69A. Modifying (S109) one or more characteristics of power provided by the center conductor 39 of the coaxial cable 19 before the power is supplied to the first power port 69A. The step of modifying (S109) may include at least one of converting an AC power signal to a DC power signal, changing a voltage level of a power signal, changing a wave form profile of a power signal, and changing a frequency of a power signal.

Reporting (S111) the measured amount of power from step (S107) to the service provider center 11, and, ultimately, billing (S113) an operator of the customer device 31 for the measured amount of power usage. If only one customer device 31 is connected to the power metering device 30, then step (S107) need only measure the power passing through the probe 37 or 59.

If more than one customer device 31 is connected to the power metering device 30, then step (S107) needs to separately measure the power passing to each power port 69A, 69B of the power metering device 30. For example, the method may further include connecting (S115) a second customer device 31' to the second power port 69B, which is directly or indirectly electrically connected to the probe 37 or 59. Measuring (S117) a second amount of power passing through the second power port 69B. Modifying (S119) one or more characteristics of power provided by the center conductor 39 of the coaxial cable 19 using the second transformer 81B before the power is supplied to the second power port 69B. Reporting (S121) the second measured amount of power from step (S117) to the service provider center 11, and, ultimately, billing (S123) a second operator of the second customer device 31' for the second measured amount of power usage.

Of course, several of the steps above may be performed in different orders. For example, the steps S101 and S103 may be reversed in order, as the probe 37 or 59 may be installed before the tap unit 33 is clamped onto the coaxial cable 19. Further, the power signal may be modified (S109) before the power signal is measured (S107) or not modified at all (if no transformer 81 is present). Various other modifications should also be considered within the purview of the method of the present invention.

Moreover, the reporting steps (S111) and (S121) may be replaced with a "meter reader" embodiment. In other words, the modem 77 may be replaced by a memory 77 to store power usage. A meter reader service technician would travel to the power metering devices 30 within his service area and would read the memories 77 to determine the power usage of the customer devices 31. Meter reading is commonly known in the existing arts, as this technique has been used to read home power meters, and may include a remote interrogator, which allows the meter reader service technician to simply stay in his vehicle and interrogate the memory 77 from a distance of up to several hundred feet away.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A power metering device comprising:
   a tap unit including a clamp for engaging onto a coaxial cable and a probe for electrically coupling to a center conductor of the coaxial cable;
   a power consumption meter electrically connected to said probe;
   an outer housing surrounding said power consumption meter; and
   a power port electrically connected to said probe, said power port for supplying power taken from the center conductor of the coaxial cable to a customer device connected to said power port, wherein said power consumption meter measures an amount of power passing through said probe or passing through said power port.

2. The power metering device of claim 1, wherein said power port is a first power port attached to said outer housing, and further comprising:
   a second power port attached to said outer housing, and wherein said power consumption meter measures the power passing through said first power port and separately measures the power passing through said second power port.

3. The power metering device of claim 1, wherein said probe includes a conductive element for electrically engaging the center conductor of the coaxial cable.

4. The power metering device of claim 3, wherein said conductive element has a sharp end for penetrating an insulation layer surrounding the center conductor of the coaxial cable.

5. The power metering device of claim 1, wherein said probe includes an inductive element for inductively coupling to the center conductor of the coaxial cable.

6. The power metering device of claim 1, wherein said tap unit clamps onto an exterior of a jacket of the coaxial cable, and wherein said tap unit is surrounded by a tap unit housing, wherein said outer housing includes a pocket dimensioned to accept said tap unit housing, and wherein said outer housing is attached to said tap unit housing after said tap unit is clamped onto the coaxial cable and nested into said pocket.

7. The power metering device of claim 1, further comprising:
   a power transformer electrically connected between said probe and said power port, wherein said transformer changes one or more characteristics of power provided by the center conductor of the coaxial cable before the power is supplied to said power port, wherein said one or more characteristics includes at least one of converting an AC power signal to a DC power signal, changing a voltage level of a power signal, changing a wave form profile of a power signal, and changing a frequency of a power signal.

8. The power metering device of claim 1, further comprising:
   a modem electrically connected to said probe and to said power consumption meter, wherein said modem receives a measured amount of power from said power consumption meter and transmits the measured amount to a service center via the center conductor of the coaxial cable.

9. The power metering device of claim 8, wherein said modem is also electrically connected to a communication port which communicates data to and from the customer device connected to said power port.

10. The power metering device of claim 9, wherein said power port also serves as said communication port.

11. The power metering device of claim 1, further comprising:
    a power transformer electrically connected between said probe and said power port, wherein said transformer changes one or more characteristics of power provided by the center conductor of the coaxial cable before the power is supplied to said power port; and
    a modem electrically connected to said probe and to said power consumption meter, wherein said modem receives a measured amount of power from said power consumption meter and transmits the measured amount to a service center via the center conductor of the coaxial cable, wherein said power transformer and said modem are surrounded by said outer housing.

12. A method of metering power consumption from a coaxial cable comprising:
providing a tap unit;
clamping the tap unit on a coaxial cable;
electronically coupling a probe of the tap unit to a center conductor of the coaxial cable;
connecting a customer device to a power port, which is electrically connected to the probe; and
measuring an amount of power passing through the probe or passing through the power port.

13. The method of claim 12, further comprising:
reporting the measured amount of power to a service center; and
billing an operator of the customer device for the measured amount of power usage.

14. The method of claim 12, wherein the customer device is a first customer device and the power port is a first power port and wherein said measuring is accomplished by measuring an amount of power passing through the first power port, and further comprising:
connecting a second customer device to a second power port, which is electrically connected to the probe;
measuring an amount of power passing through the second power port;
reporting a first measured amount of power passing through the first port to a service center;
reporting a second measured amount of power passing through the second port to the service center;
billing a first operator of the first customer device for the first measured amount of power usage; and
billing a second operator of the second customer device for the second measured amount of power usage.

15. The method of claim 12, further comprising:
providing a power transformer electrically connected between the probe and the power port; and
modifying one or more characteristics of power provided by the center conductor of the coaxial cable before the power is supplied to the power port, wherein said modifying includes at least one of converting an AC power signal to a DC power signal, changing a voltage level of a power signal, changing a wave form profile of a power signal, and changing a frequency of a power signal.

16. A power metering device comprising:
a tap unit including a clamp for engaging onto a coaxial cable and a probe for electrically coupling to a center conductor of the coaxial cable;
a power port electrically connected to said probe, said power port for supplying power taken from the center conductor of the coaxial cable to a customer device connected to said power port;
a power transformer electrically connected between said probe and said power port, wherein said transformer changes one or more characteristics of power provided by the center conductor of the coaxial cable before the power is supplied to said power port; and
an outer housing surrounding said power transformer.

17. The power metering device of claim 16, wherein said power port is a first power port attached to said outer housing, and further comprising:
a second power port attached to said outer housing, wherein said power transformer changes one or more characteristics of power provided by the center conductor of the coaxial cable before the power is supplied to said first power port, wherein said power transformer changes one or more characteristics of power provided by the center conductor of the coaxial cable before the power is supplied to said second power port, and wherein power supplied by said second port has different characteristics than power supplied by said first port.

18. The power metering device of claim 16,
wherein said probe includes a conductive element for electrically engaging the center conductor of the coaxial cable, and wherein said conductive element has a sharp end for penetrating an insulation layer surrounding the center conductor of the coaxial cable, or
wherein said probe includes an inductive element for inductively coupling to the center conductor of the coaxial cable.

19. The power metering device of claim 16, wherein said tap unit clamps onto an exterior of a jacket of the coaxial cable, wherein said tap unit is surrounded by a tap unit housing, wherein said outer housing includes a pocket dimensioned to accept said tap unit housing, and wherein said outer housing is attached to said tap unit housing after said tap unit is clamped onto the coaxial cable and nested into said pocket.

20. The power metering device of claim 16, wherein said one or more characteristics includes at least one of converting an AC power signal to a DC power signal, changing a voltage level of a power signal, changing a wave form profile of a power signal, and changing a frequency of a power signal.

* * * * *